(12) United States Patent
Tarui

(10) Patent No.: US 8,513,763 B2
(45) Date of Patent: Aug. 20, 2013

(54) SILICON CARBIDE SEMICONDUCTOR DEVICE

(75) Inventor: Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 177 days.

(21) Appl. No.: 12/820,480

(22) Filed: Jun. 22, 2010

(65) Prior Publication Data
US 2011/0095301 A1    Apr. 28, 2011

(30) Foreign Application Priority Data
Oct. 28, 2009   (JP) ................. 2009-247296

(51) Int. Cl.
*H01L 29/47* (2006.01)
*H01L 23/544* (2006.01)

(52) U.S. Cl.
USPC ............... 257/471; 257/797; 257/E29.338; 257/E21.359

(58) Field of Classification Search
USPC ............. 257/471, E29.148, 155, 284, 797, 257/E31.074, E27.04, E29.013, E29.041, 257/E29.178, E29.271, E29.311, E29.338, 257/E21.047, E21.064, E21.359, E21.368; 438/167, 169, FOR. 173, FOR. 197, 570
See application file for complete search history.

(56) References Cited

U.S. PATENT DOCUMENTS

| 6,104,043 | A   | 8/2000  | Hermansson et al. |
| 6,404,032 | B1  | 6/2002  | Kitada et al. |
| 6,576,973 | B2  | 6/2003  | Collard et al. |
| 7,186,609 | B2  | 3/2007  | Korec et al. |
| 2002/0125541 | A1* | 9/2002  | Korec et al. ............ 257/471 |
| 2002/0177325 | A1* | 11/2002 | Takewaka et al. ........ 438/745 |
| 2004/0043579 | A1* | 3/2004  | Nuetzel et al. ........... 438/401 |
| 2004/0256690 | A1* | 12/2004 | Kocon ..................... 257/471 |
| 2007/0023781 | A1  | 2/2007  | Mizukami et al. |
| 2007/0228505 | A1* | 10/2007 | Mazzola et al. ........... 257/471 |
| 2009/0289262 | A1* | 11/2009 | Zhang et al. ............ 257/77 |

FOREIGN PATENT DOCUMENTS

| DE | 197 23 176 C1 | 8/1998 |
| JP | 10-41527      | 2/1998 |
| JP | 3551154       | 5/2004 |
| JP | 3630594       | 12/2004 |

(Continued)

OTHER PUBLICATIONS

Chinese Office Action issued Jul. 4, 2012, in Chinese Application No. 2010102435495, w/Partial English Translation.

(Continued)

*Primary Examiner* — Matthew Landau
*Assistant Examiner* — Khaja Ahmad
(74) *Attorney, Agent, or Firm* — Oblon, Spivak, McClelland, Maier & Neustadt, L.L.P.

(57) ABSTRACT

There was a problem that it was difficult to manufacture silicon carbide semiconductor devices with suppressed variations in characteristics without increasing the number of process steps. A silicon carbide semiconductor device according to the present invention includes an N type SiC substrate and an N type SiC epitaxial layer as a silicon carbide semiconductor substrate of a first conductivity type, a plurality of recesses intermittently formed in a surface of the N type SiC epitaxial layer, P type regions as second-conductivity-type semiconductor layers formed in the N type SiC epitaxial layer in the bottoms of the plurality of recesses, and a Schottky electrode selectively formed over the surface of the N type SiC epitaxial layer, wherein the plurality of recesses all have an equal depth.

6 Claims, 5 Drawing Sheets

(56) References Cited

FOREIGN PATENT DOCUMENTS

| | | |
|---|---|---|
| JP | 2006-186134 | 7/2006 |
| JP | 2009-105200 | 5/2009 |
| JP | 2009-170558 | 7/2009 |

OTHER PUBLICATIONS

Office Action issued Oct. 15, 2012 in German Patent Application No. 10 2010 042 998.8-33 (with partial English translation).

* cited by examiner

SILICON CARBIDE SEMICONDUCTOR DEVICE

BACKGROUND OF THE INVENTION

1. Field of the Invention

The present invention relates to silicon carbide semiconductor devices, and particularly to a silicon carbide semiconductor device having a JBS (Junction Barrier controlled Schottky diode) or MPS (Merged P-i-N/Schottky diode) structure using silicon carbide.

2. Description of the Background Art

Silicon carbide used for silicon carbide semiconductor devices has dielectric breakdown electric field that is about ten times that of silicon, and band gap that is about three times wider than that of silicon. Accordingly, power devices using silicon carbide are lower-resistant and higher-temperature operable as compared with currently available power devices as semiconductor devices using silicon. Particularly, SBDs (Schottky barrier diodes) and MOSFETs using silicon carbide are showing great promise because their losses during operation are smaller as compared with currently available silicon pn diodes and IGBTs at same withstand voltages. Especially, Schottky diodes, having simpler device structures, are under intensive development for practical use.

Problems of Schottky diodes are that the leakage current at the time of application of a reverse bias is large when higher withstand voltages are desired, and that the loss at the time of current conduction is large. For measures against these problems, JBSs (Junction Barrier controlled Schottky diodes) and MPSs (Merged P-i-N/Schottky diodes) are proposed. Both structures are characterized in that P type regions are formed under the Schottky electrode, at the ends of the electrode, and in the vicinity of the electrode.

In U.S. Pat. No. 3,630,594, for example, P type regions with different depths and different concentrations are formed under the Schottky electrode and at the ends of the electrode. In this case, it is necessary to perform ion implantation twice, in order to form the different P regions. Also, in U.S. Pat. No. 3,551,154, P type regions with the same depth and same concentration are formed under the Schottky electrode, at the ends of the electrode, and in its vicinity, but it has no alignment mark for mask arrangement. Accordingly, characteristics tend to vary due to misalignment.

For conventional silicon carbide JBS or MPS structures, it was difficult to manufacture silicon carbide semiconductor devices with suppressed variations in characteristics without increasing the number of process steps.

SUMMARY OF THE INVENTION

An object of the present invention is to provide a silicon carbide semiconductor device which is manufactured without increasing the number of process steps and in which variations in characteristics are suppressed.

A silicon carbide semiconductor device according to the present invention includes a silicon carbide semiconductor substrate of a first conductivity type and a plurality of recesses intermittently formed in a surface of the silicon carbide semiconductor substrate. It further includes semiconductor layers of a second conductivity type formed in the silicon carbide semiconductor substrate, in bottoms of the plurality of recesses, and a Schottky electrode selectively formed over the surface of the silicon carbide semiconductor substrate. The plurality of recesses all have an equal depth.

The plurality of recesses all have an equal depth, and silicon carbide semiconductor devices in which variations in characteristic are suppressed can be provided without increasing the number of process steps.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

<A-1. Structure>

Figure 1A:
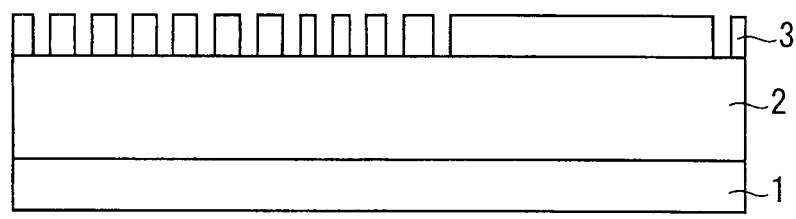
FIGS. 1A to 1C are diagrams illustrating a silicon carbide semiconductor device and a method of manufacturing the same according to a first preferred embodiment.
Figure 1B:
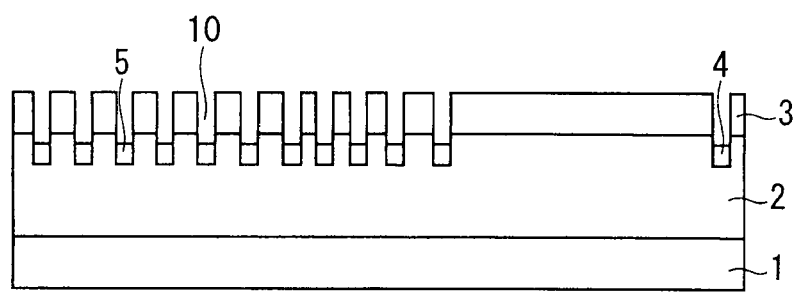
Figure 1C:
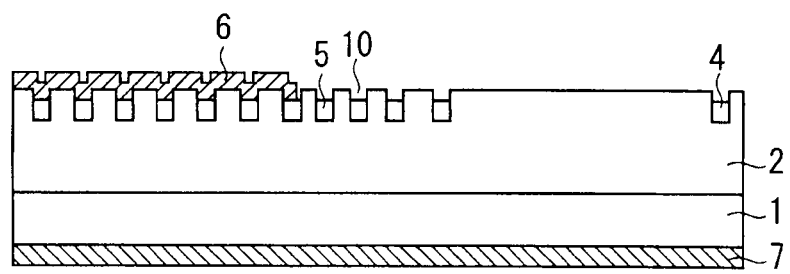

FIGS. 1A to 1C are diagrams illustrating a silicon carbide semiconductor device and a method of manufacturing the same according to a first preferred embodiment of the present invention. A mask 3, e.g. resist or an oxide film, is formed on a surface of an N type SiC epitaxial layer 2 in which N− type SiC is formed by epitaxial growth on an N+ type SiC substrate 1, as a silicon carbide semiconductor substrate of a first conductivity type (FIG. 1A).

Ion implantation and dry etching are performed by using the mask 3, to intermittently form a plurality of recesses 10 in the surface of the N type SiC epitaxial layer 2. Further, ions are implanted into the recesses 10 to form P type regions 5 as semiconductor layers of a second conductivity type in the bottoms of the plurality of recesses 10 (FIG. 1B). Part of the recesses 10 are used as alignment mark(s) 4 for positioning.

Finally, a Schottky electrode 6 is selectively formed over the surface of the N type SiC epitaxial layer 2, so as to form a JBS or MPS structure using silicon carbide (FIG. 1C). Also, an ohmic electrode 7 is formed on the back of the N type SiC substrate 1. This structure is characterized in that the recesses 10 have an equal depth and that the P type regions 5 have an equal depth and equal concentration.

Thus, the plurality of recesses 10 including the alignment mark 4, the P type regions 5 under the Schottky electrode 6, and the P type regions 5 in the vicinity of the Schottky electrode 6 are formed by using the same mask 3, so that the number of manufacturing process steps is not increased. Also, the P type regions 5 are formed in deeper regions than when they are formed in the surface of the N type SiC epitaxial layer 2, so that the electric field to the Schottky electrode 6 is alleviated, and the leakage current at the time of application of a reverse bias and the loss at the time of conduction of current are suppressed.

Figure 2A:
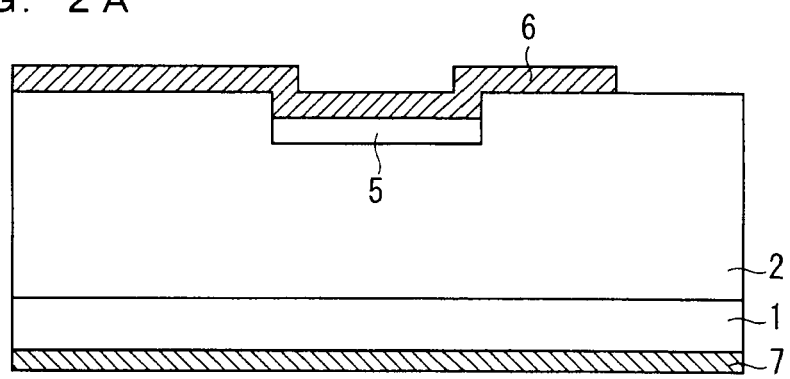
FIGS. 2A and 2B are diagrams illustrating the silicon carbide semiconductor device and its manufacturing method of the first preferred embodiment.
Figure 2B:
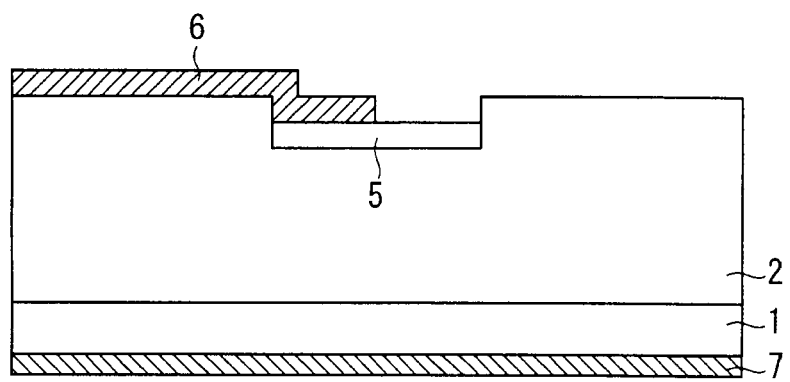

Also, as shown in FIGS. 2A and 2B, the position of an end of the Schottky electrode 6 is located at the bottom of the recess 10, and the end of the Schottky electrode 6 is formed on the P type region 5 in the bottom of the recess 10 (FIG. 2B), and then the electric field is alleviated than when it is formed on the N type SiC epitaxial layer 2 where no recess 10 is present (FIG. 2A), and the leakage current at the time of application of a reverse bias is made smaller.

<A-2. Effects>

According to the first preferred embodiment of the present invention, a silicon carbide semiconductor device includes an N type SiC substrate 1 and an N type SiC epitaxial layer 2 as a silicon carbide semiconductor substrate of a first conductivity type, a plurality of recesses 10 intermittently formed in a surface of the N type SiC epitaxial layer 2, P type regions 5 as second-conductivity-type semiconductor layers formed in the N type SiC epitaxial layer 2 in the bottoms of the plurality of recesses 10, and a Schottky electrode 6 selectively formed over the surface of the N type SiC epitaxial layer 2, wherein the plurality of recesses 10 all have an equal depth, whereby variations in characteristics of the silicon carbide semiconductor device can be suppressed without increasing the number of manufacturing process steps.

Also, according to the first preferred embodiment of the present invention, in the silicon carbide semiconductor device, the Schottky electrode 6 has an end on a P type region 5 as a semiconductor layer, whereby the electric field is alleviated than when it is formed on the N type SiC epitaxial layer 2 where no recess 10 is present, and the leakage current at the time of application of a reverse bias is made smaller.

B. Second Preferred Embodiment

<B-1. Structure>

Figure 3A:
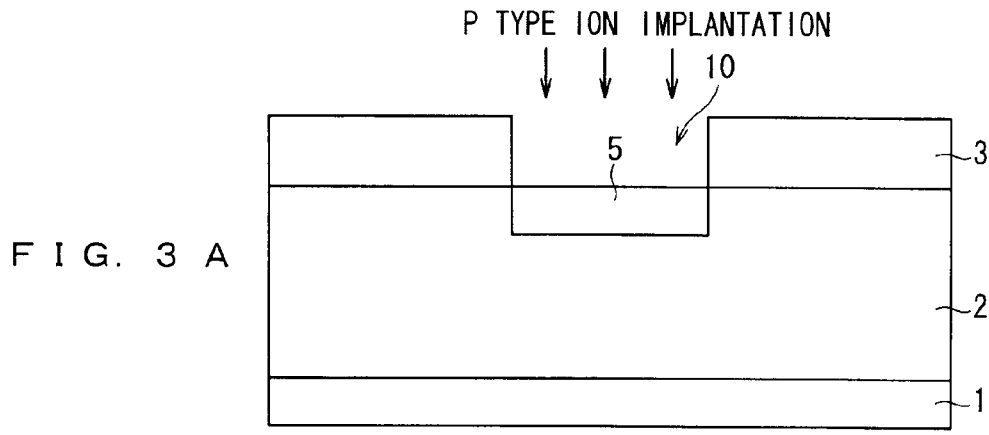
FIGS. 3A to 3D are diagrams illustrating a silicon carbide semiconductor device and a method of manufacturing the same according to a second preferred embodiment.
Figure 3B:
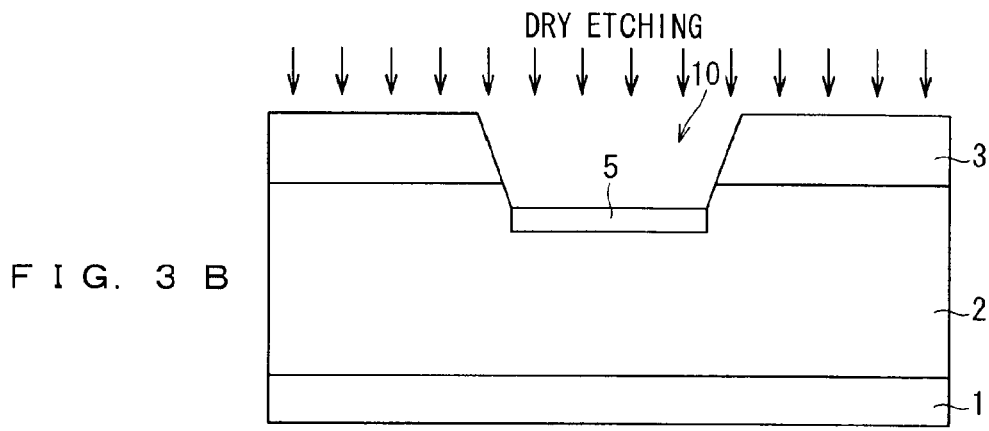

FIGS. 3A to 3D are diagrams illustrating a silicon carbide semiconductor device and a method of manufacturing the same according to a second preferred embodiment of the present invention. In the method of manufacturing the silicon carbide semiconductor device according to the first preferred embodiment, by using the same mask 3, ion implantation is first performed as shown in FIG. 3A, and next dry etching is performed (FIG. 3B). The dry etching is performed with a smaller selective ratio of SiC with respect to the mask 3 (the etching rate of SiC is slower), and the sides of the recess 10 are tapered.

The tapered form alleviates the electric field to the Schottky electrode 6 (FIG. 3C) than when each recess 10 has vertical sides (FIG. 3D), whereby the leakage current at the time of application of a reverse bias is made smaller. Also, because the P type region 5 is formed only in the bottom, the effective area of the Schottky electrode 6 is not made smaller, and an increase of loss at the time of current conduction, due to the formation of the P type region 5, is suppressed.

<B-2. Effects>

According to the second preferred embodiment of the present invention, in a silicon carbide semiconductor device, the sides of a plurality of recesses 10 are tapered, and the electric field to the Schottky electrode 6 is alleviated than when each recess 10 has vertical sides, and the leakage current at the time of application of a reverse bias is made smaller.

Also, by forming the P type region 5 only in the bottom of the recess 10, the effective area of the Schottky electrode 6 is not made smaller, and the increase of loss at the time of current conduction is suppressed.

C. Third Preferred Embodiment

<C-1. Structure>

Figure 4A:
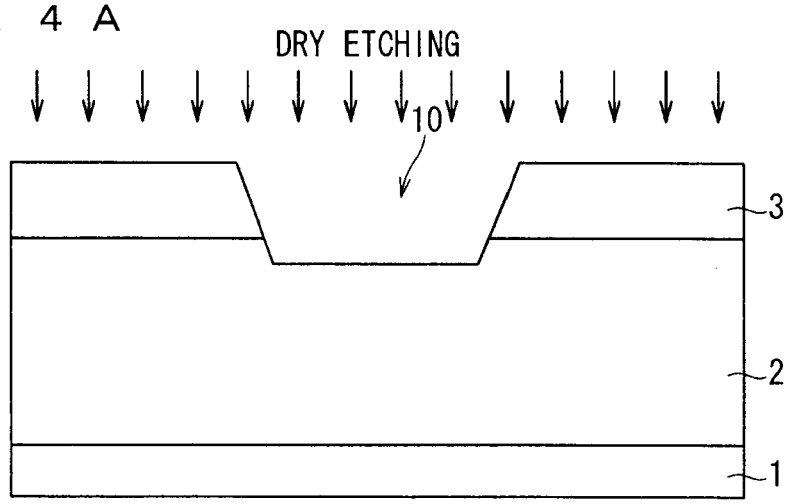
FIGS. 4A to 4C are diagrams illustrating a silicon carbide semiconductor device and a method of manufacturing the same according to a third preferred embodiment.
Figure 4B:
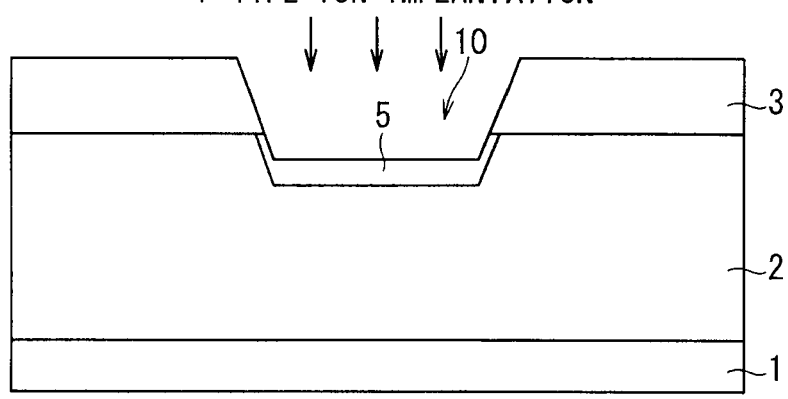
Figure 4C:
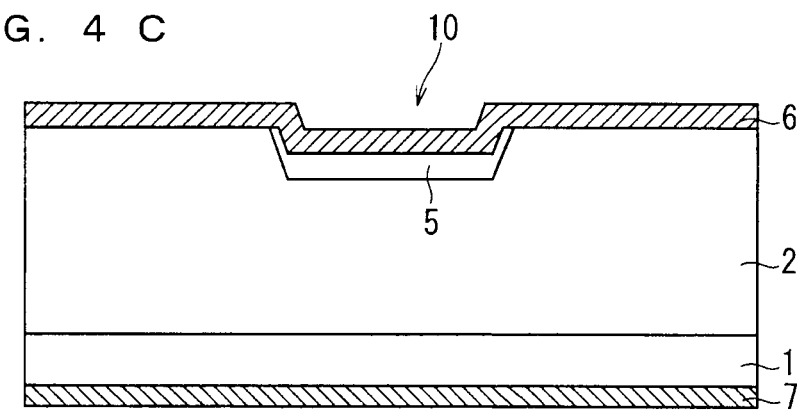

FIGS. 4A to 4C are diagrams illustrating a silicon carbide semiconductor device and a method of manufacturing the same according to a third preferred embodiment of the present invention. In the silicon carbide semiconductor device manufacturing method of the first preferred embodiment, dry etching is performed first, by using the same mask 3. The dry etching is performed with a smaller selective ratio of SiC with respect to the mask 3 (the etching rate of SiC is slower), so that the recess 10 is tapered (FIG. 4A).

Figure 3C:
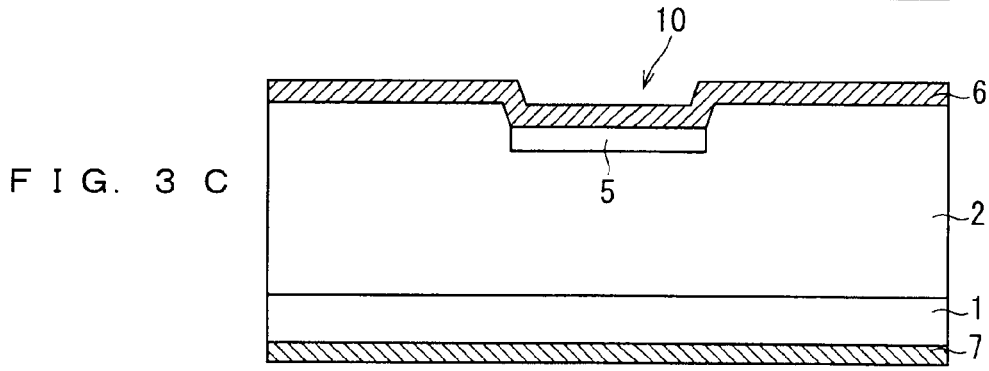
Figure 3D:
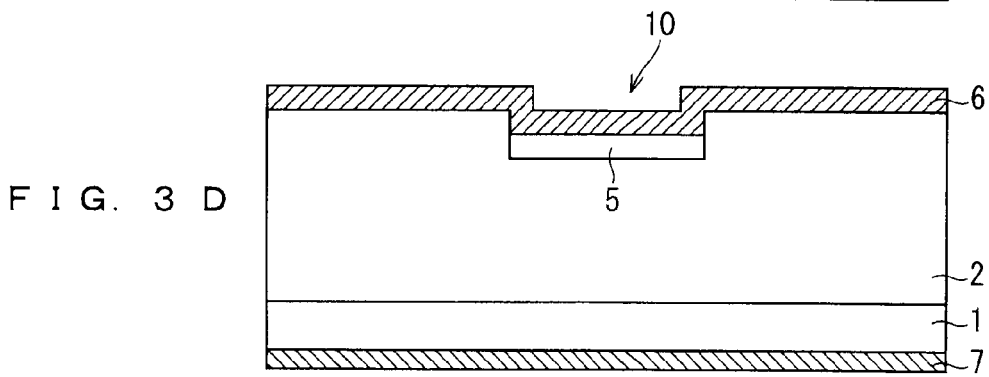

Next, ion implantation is performed, and the P type region 5 is formed also in the sides of the plurality of recesses 10 (FIG. 4B). The P type region 5 forms the corners of the upper surface of the recess 10 (FIG. 4C), and the electric field to the Schottky electrode 6 is further alleviated than when the P type region 5 is formed only in the bottom of the recess 10 (FIG. 3C).

Also, when silicon carbide is used, ion-implanted dopant is not diffused by thermal processing, and therefore ion implantation at high energy is necessary in order to form the P type regions 5 in deeper regions. However, the need for a high-energy ion implantation system can be eliminated and manufacturing costs can be reduced by performing ion implantation to form the P type regions 5 after forming the recesses 10 by dry etching.

<C-2. Effects>

According to the third preferred embodiment of the present invention, in a silicon carbide semiconductor device, the P type regions 5 as semiconductor layers are formed also in the sides of the plurality of recesses 10, whereby the electric field to the Schottky electrode 6 is alleviated.

D. Fourth Preferred Embodiment

<D-1. Structure>

Figure 5:
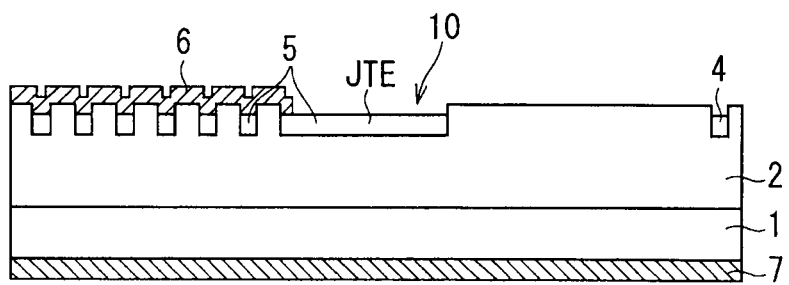
FIG. 5 is a diagram illustrating a silicon carbide semiconductor device and a method of manufacturing the same according to a fourth preferred embodiment.

FIG. 5 is a diagram illustrating a silicon carbide semiconductor device and a method manufacturing the same according to a fourth preferred embodiment of the present invention. In the silicon carbide semiconductor device manufacturing method of the first preferred embodiment, the silicon carbide semiconductor device has a recess 10 that is formed in the vicinity of the Schottky electrode 6 and that is not in contact with the Schottky electrode 6, and the recess 10 not in contact with the Schottky electrode 6 includes only the alignment mark 4, and P type regions 5 are formed in individual recesses 10. A P type region 5 in contact with an end of the Schottky electrode 6 functions as a JTE (Junction Termination Extension), and this alleviates the electric field at the end of the Schottky electrode 6.

<D-2. Effects>

According to the fourth preferred embodiment of the present invention, in a silicon carbide semiconductor device, a plurality of recesses 10 include one or a plurality of recess(es) 10 not in contact with the Schottky electrode 6, and the one or plurality of recess(es) 10 are all alignment mark(s) 4 for positioning, whereby the P type region 5 in a recess 10 at an end of the Schottky electrode 6 can function as a JTE.

E. Fifth Preferred Embodiment

<E-1. Structure>

Figure 6:
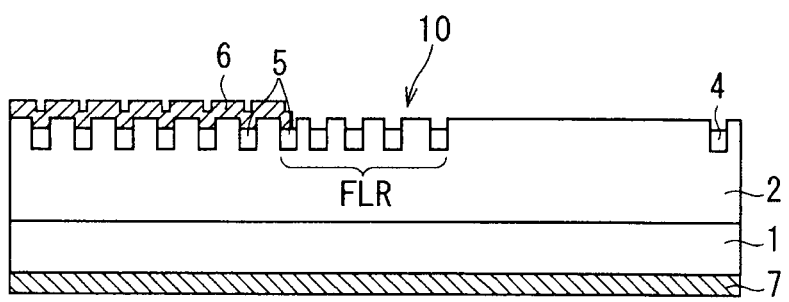
FIG. 6 is a diagram illustrating a silicon carbide semiconductor device and a method of manufacturing the same according to a fifth preferred embodiment.

FIG. 6 is a diagram illustrating a silicon carbide semiconductor device and a method manufacturing the same according to a fifth preferred embodiment of the present invention. In the silicon carbide semiconductor device manufacturing method of the first preferred embodiment, the silicon carbide semiconductor device has one or a plurality of recess(es) 10 that are formed in the vicinity of the Schottky electrode 6 and are not in contact with the electrode, and part of the recess(es) 10 are alignment mark(s) 4, and P type regions 5 are formed in individual recesses 10. The P type regions 5 in recesses 10 that are located in the vicinity of the Schottky electrode 6 and that are not alignment marks 4 function as FLR (Field Limiting Ring), and this alleviates the electric field at the end of the Schottky electrode 6.

The width and intervals of the P type regions 5 in the FLR portion and the width and intervals of the P type regions 5 under the Schottky electrode 6 are independently controlled, whereby an optimum structure for alleviating the electric fields in the respective regions can be formed.

<E-2. Effects>

According to the fifth preferred embodiment of the present invention, in a silicon carbide semiconductor device, a plurality of recesses 10 include one or a plurality of recess(es) 10 not in contact with the Schottky electrode 6, and part of the one or plurality of recess(es) 10 function as alignment mark(s) 4 as positioning mark(s), whereby the P type regions 5 in recesses 10 at an end of the Schottky electrode 6 can function as FLR.

Also, according to the fifth preferred embodiment of the present invention, in the silicon carbide semiconductor device, the intervals between the plurality of recesses 10 and the widths of the plurality of recesses 10 are different between under the Schottky electrode 6 and in its vicinity, whereby an optimum structure for alleviating the electric fields in the respective regions can be formed.

While the invention has been described in detail, the foregoing description is in all aspects illustrative and not restrictive. It is understood that numerous other modifications and variations can be devised without departing from the scope of the invention.

What is claimed is:

1. A silicon carbide semiconductor device comprising:
    a silicon carbide semiconductor substrate of a first conductivity type;
    a plurality of recesses intermittently formed in a surface of said silicon carbide semiconductor substrate;
    semiconductor layers of a second conductivity type formed in said silicon carbide semiconductor substrate, in bottoms of said plurality of recesses; and
    a Schottky electrode selectively formed over said surface of said silicon carbide semiconductor substrate,
    said plurality of recesses all having an equal depth,
    wherein said plurality of recesses include one or more recesses not in contact with said Schottky electrode,
    wherein one or more of the one or more recesses not in contact with said Schottky electrode are alignment marks, and
    wherein said one or more recesses not in contact with said Schottky electrode are not covered by the Schottky electrode.

2. The silicon carbide semiconductor device according to claim 1, wherein said Schottky electrode has an end on said semiconductor layer.

3. The silicon carbide semiconductor device according to claim 1, wherein sides of said plurality of recesses are tapered.

4. The silicon carbide semiconductor device according to claim 1, wherein said semiconductor layers are formed also in sides of said plurality of recesses.

5. The silicon carbide semiconductor device according to claim 1, wherein intervals between said plurality of recesses and widths of said plurality of recesses are different between under said Schottky electrode and in its vicinity.

6. The silicon carbide semiconductor device according to claim 1, wherein the one or more of the one or more recesses not in contact with the Schottky electrode are alignment marks even after the selective formation of the Schottky electrode.

* * * * *